United States Patent

Bosch et al.

Patent Number: 5,266,957
Date of Patent: Nov. 30, 1993

[54] PROXIMITY FUZE TRANSCEIVER

[75] Inventors: Donald M. Bosch, Plymouth; Steven J. Loughran, Eden Prairie; Scott M. Thomas, Maple Grove, all of Minn.

[73] Assignee: Alliant Techsystems Inc., Edina, Minn.

[21] Appl. No.: 966,275

[22] Filed: Oct. 26, 1992

Related U.S. Application Data

[63] Continuation-in-part of Ser. No. 712,931, Jun. 10, 1991, Pat. No. 5,159,346.

[51] Int. Cl.$^5$ .......................... G01S 13/26; H03B 7/06
[52] U.S. Cl. ...................... 342/200; 342/68; 331/117 R
[58] Field of Search .......... 342/68, 200, 175; 331/117 R

[56] References Cited

U.S. PATENT DOCUMENTS

| | | | |
|---|---|---|---|
| 3,323,513 | 6/1967 | Gnadke | 331/117 |
| 4,189,688 | 2/1980 | Sechi et al. | 331/117 FE |
| 4,216,443 | 8/1980 | Zaderej | 331/115 |
| 4,621,239 | 11/1986 | Tserng | 331/99 |
| 4,873,497 | 10/1989 | Kielmeyer, Jr. | 331/108 B |
| 4,931,790 | 6/1990 | Wen et al. | 342/110 |

FOREIGN PATENT DOCUMENTS

| | | |
|---|---|---|
| 118342 | 9/1984 | European Pat. Off. |
| 318382 | 5/1989 | European Pat. Off. |
| 61-090502 | 8/1986 | Japan |
| 1140750 | 1/1969 | United Kingdom ......... 331/117 FE |

OTHER PUBLICATIONS

Robert Lynn Cravens, "Development of a Broadband Microwave Oscillator" thesis, Univeristy of Wisconsin, Madison, 1990.
English Abstract of EP 118,342 from Derwents World Patent Computer Database.
English Abstract of EP 318,382 from Derwents World Patent Computer Database.

*Primary Examiner*—Gilberto Barron, Jr.
*Attorney, Agent, or Firm*—Merchant, Gould, Smith, Edell, Welter & Schmidt

[57] ABSTRACT

A voltage controlled oscillator is disclosed in a "ring" configuration using two BJTs. The design uses an active feedback topology which eliminates the need for a tank circuit for oscillation to occur. The design also provides for the mixing function to be performed by one of the BJTs.

14 Claims, 3 Drawing Sheets

PROXIMITY FUZE TRANSCEIVER

This application is a continuation-in-part of U.S. patent application Ser. No. 07/712,931, filed Jun. 10, 1991.

Technical Field of the Invention

The present invention relates generally to an electrical circuit, and more particularly to a voltage controlled oscillator using two bipolar junction transistors in a ring configuration.

Background of the Invention

In certain applications or environments, several transceiver performance characteristics may be sacrificed in order to achieve size, cost, number of devices, and other manufacturing considerations. One such application is in a proximity fuze transceiver environment, and more specifically such as in explosive projectiles, bullets, etc.

Previously, single bipolar junction transistors ("BJT") have been used in oscillator circuits. Some of these circuits have simultaneously performed transceiver functions. However, such single BJT's have been used with a tank circuit connected from the emitter to ground. As used herein, "tank circuit" shall be defined in the ordinary sense as will be appreciated by those skilled in the art (i.e., a parallel LC circuit). Some of these circuits also used a mixer connected at the collector, which also functioned as the RF input-output. Therefore, since the device relied on the transistor being saturated to perform the mixing function, one drawback of such a device is that no amplification of the incoming signal occurred.

Other drawbacks of typical prior art devices discussed above included a lack of active feedback. Also, since a single BJT was utilized with its emitter connected to the tank circuit to ground, any variances in the base to emitter capacitance (i.e., due to fabrication or processing) changed the frequency of the oscillation for each device. Still further, the modulated signal was amplified to the IF output (i.e., modulation feed through) since these ports were not isolated from one another in the prior art configuration.

In addition to these drawbacks, it is believed that the next generation of high-frequency proximity fuze sensors will use GaAs microwave monolithic integrated circuits (MMIC). These radar circuits exhibit limited radar range due to high oscillator phase noise characteristics inherent in GaAs. Further, the GaAs material technology produces a higher chip cost due to higher material and processing costs, and lower circuit yields. Therefore, there is a need for a low cost ranging radar (LCR2) architecture which does not have the limitations of GaAs. Such an architecture would be significantly simpler than existing GaAs chip radars, resulting in lower power consumption, a much smaller circuit size, and lower chip cost.

Accordingly, there is a need for a voltage controlled oscillator having active feedback, a virtual ground at the emitter, better isolation to minimize modulation feedthrough, and no element to ground required to oscillate the circuit (i.e., a tank circuit is not required), which utilizes an $LCR^2$ architecture.

SUMMARY OF THE INVENTION

The present invention provides for a simple-to-integrate, compact and flexible VCO design, including optional transceiver functionality. The VCO may be co-integrated with other bipolar circuits. A preferred application of the invention is as a proximity fuze transceiver. However, such application is only one of the innumerable uses in which the principles of the present invention may be employed.

In a preferred embodiment of the transceiver constructed according to the principles of the present invention, the transceiver comprises a pair of bipolar transistors (Q1 and Q2) connected in a "ring-type" configuration. The transistors are connected such that the collector of the first transistor (Q1) is connected to the base of the second transistor (Q2) through capacitor C2, and the collector of the second transistor (Q2) is connected to the base of the first transistor (Q1) through capacitor C1. Oscillations build up to a steady state level from broad band thermal noise.

The thermal noise is amplified and phase shifted versus frequency by transistors Q1 and Q2. Capacitors C1 and C2 reverse the transistor phase shift. At a specific frequency a resultant 0° phase shift will occur. Thus, the feedback wave form adds in phase with the Q1 input, while the output oscillation amplitude increases until Q2 saturation.

More specifically, device Q2 acts as a receive amplifier and device Q1 performs the power amplification and mixing function. Bias resistor R1 is selected to ensure device Q1 is voltage saturated and the output of which will not drive Q2 into saturation. This minimizes the receiver conversion loss and noise figure. The two device active feedback in the preferred configuration generates the negative resistance necessary for oscillations. Capacitors C1 and C2, and the transistors through-put phase shift sets the oscillation frequency by maintaining 0° phase shift around the loop. Inductor L1 centers the negative resistance at the desired operating frequency. The FM deviation is accomplished using a bipolar transistor (Q3) reversed biased base-emitter junction as a variable capacitor to form a parallel resonance with L1. The RF/IF conversion gain is accomplished using an additional bipolar transistor (Q4) which is DC-coupled to the transceiver IF output. This eliminates the decoupling capacitor thereby allowing 0 range detection and provides a low impedance driver to the processing circuitry.

One feature of the present invention is that there is no requirement for a tank circuit in order for the transceiver to oscillate. The capacitors C1 and C2 set the oscillator frequency. This provides a versatile oscillator circuit topology to be used at any desired frequency by solely changing the values of capacitors C1 and C2.

A second advantage is that implanted varactor and mixer diodes are not required. This simplifies the fabrication of the circuit and allows for the entire circuit to be realizable with silicon integrated circuit technology.

A third advantage is that the modulation input is isolated from the IF output, thereby virtually eliminating all modulation feedthrough.

Still another feature of the present invention is the use of active feedback. This eliminates the need for a resonator, and also allows using a device Q1 which is much larger than device Q2 in order to increase output power and still operate as a mixer.

Yet another advantage of the present invention is the use of the virtual ground tying the emitters of Q1 and Q2 together. By doing so, variances in the base-emitter capacitance of the devices does not effect the oscillation frequency. Accordingly capacitor C1 may be chosen to set the frequency at which the transceiver is desired to operate.

Therefore, according to one aspect of the invention, there is provided an oscillator comprising: a) a first bipolar junction transistor ("BJT"), having a base, a collector and an emitter; b) a second BJT, having a base, a collector and an emitter, wherein said collector of said first BJT is cooperatively connected to said base of said second BJT through a second capacitive device, said collector of said second BJT is cooperatively connected to said base of said first BJT through a first capacitive device, and said emitters are connected together, wherein when said first and second BJT are properly biased a zero phase shift oscillation occurs from said base to said collector of said first BJT through said second capacitive device, to said base to said collector of said second BJT through said first capacitive device, and to said base of said first BJT, whereby a tank circuit is not required for the oscillation to occur.

According to another aspect of the invention, there is provided a device as described above, further including a first inductive means, cooperatively connected said collector of said first BJT, for centering the negative resistance of the oscillator, wherein higher frequency oscillations can be achieved.

According to another aspect of the invention, there is provided a device as described above, further including variable capacitor means in parallel with second inductor means, cooperatively connected to said collector of said second BJT, for varying the oscillation frequency as a function of voltage.

According to still another aspect of the invention, there is provided an oscillator as described above, further including an IF output port cooperatively connected to said first inductive means, said port comprising a high frequency filter and an amplifier device.

According to a further aspect of the invention, there is provided an oscillator described above, further including a capacitive device cooperatively connected to ground from said emitters, wherein said first BJT operates as a mixer.

These and other advantages and features which characterize the present invention are pointed out with particularity in the claims annexed hereto and forming a further part hereof. However, for a better understanding of the invention, its advantages and objects obtained by its use, reference should be made to the Drawings which form a further part hereof and to the accompanying descriptive matter, in which there is illustrated and described a preferred embodiment of the present invention.

BRIEF DESCRIPTION OF THE DRAWINGS

In the Drawings, wherein the like parts are referenced by like numerals throughout the several views.

DETAILED DESCRIPTION

The principles of this invention apply particularly well to an oscillator utilizing bipolar junction transistors. A preferred application for this invention is in a radar environment, wherein size, power and cost are design criteria. Such preferred application, however, is typical of only one of the innumerable types of applications in which the principles of the present invention can be employed.

Figure 1:
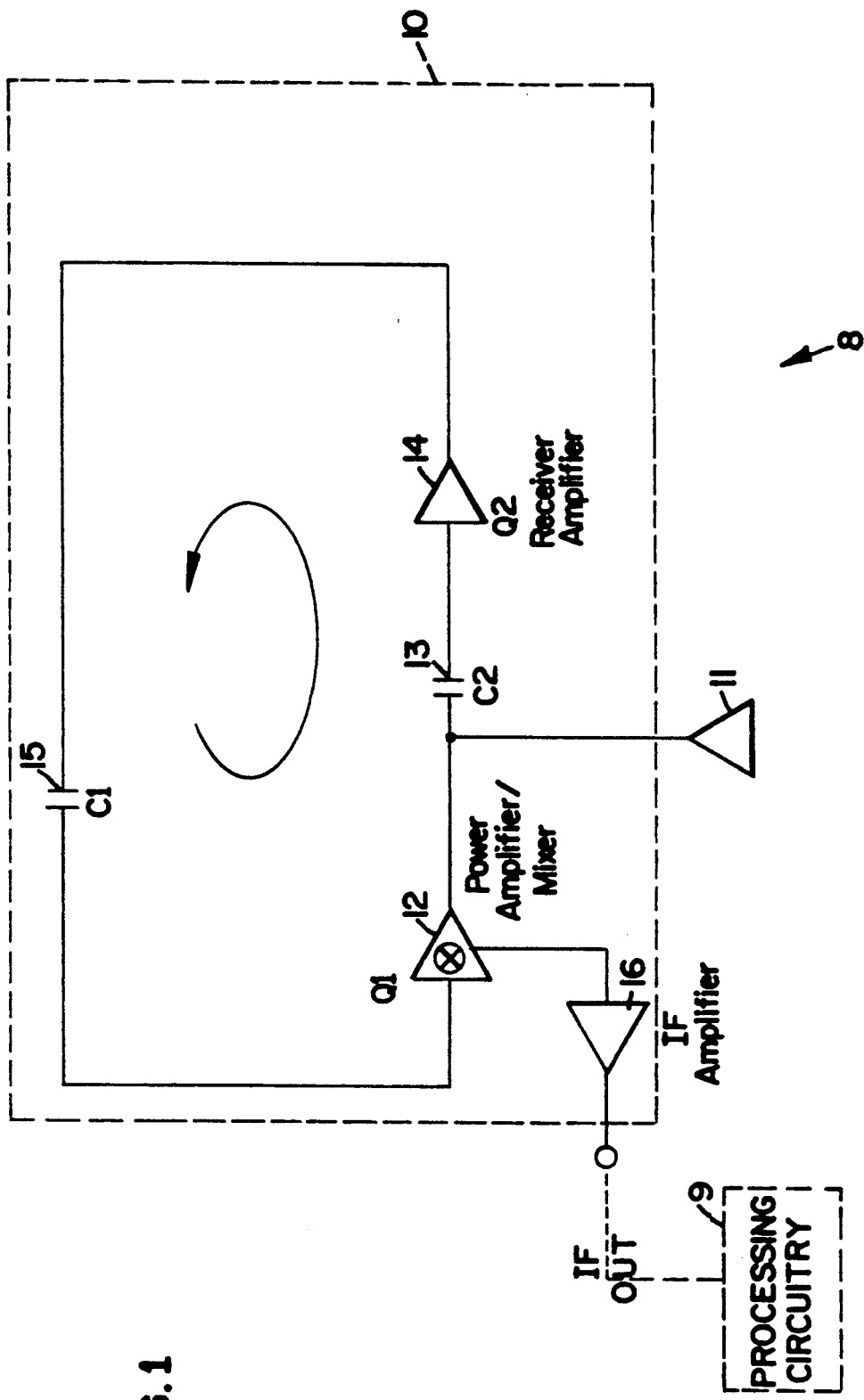
FIG. 1 is a block diagram illustrating application of the present invention in a radar system.

Referring now to the Figs., there is illustrated a preferred embodiment of a ring transceiver circuit. The transceiver is shown generally at 10. In FIG. 1, the transceiver 10 is illustrated as being connected to a radar antenna 11, and connected to processing circuitry 9 at the IF output. Those skilled in the art will appreciate the components of such a radar system 9 and its operation. Therefore, the system 9 will not be described in detail herein, other than to briefly note the various components illustrated in FIG. 1.

Antenna 11 is connected between a capacitor (C2) 13 and power amplifier/mixer (Q1) designated as 12. Signals from the antenna 11 are passed through capacitor (C2) 13 to receiver amplifier (Q2) designated as 14. Here, the signals are amplified and transmitted to power amplifier mixer (Q1) 12 through capacitor (C1) 15. The IF output taps the signal at this point through IF amplifier 16. Those skilled in the art will recognize that the mixer function provides a difference frequency of the receiver RF and LO (Local oscillator).

Transceiver Design

Figure 2:
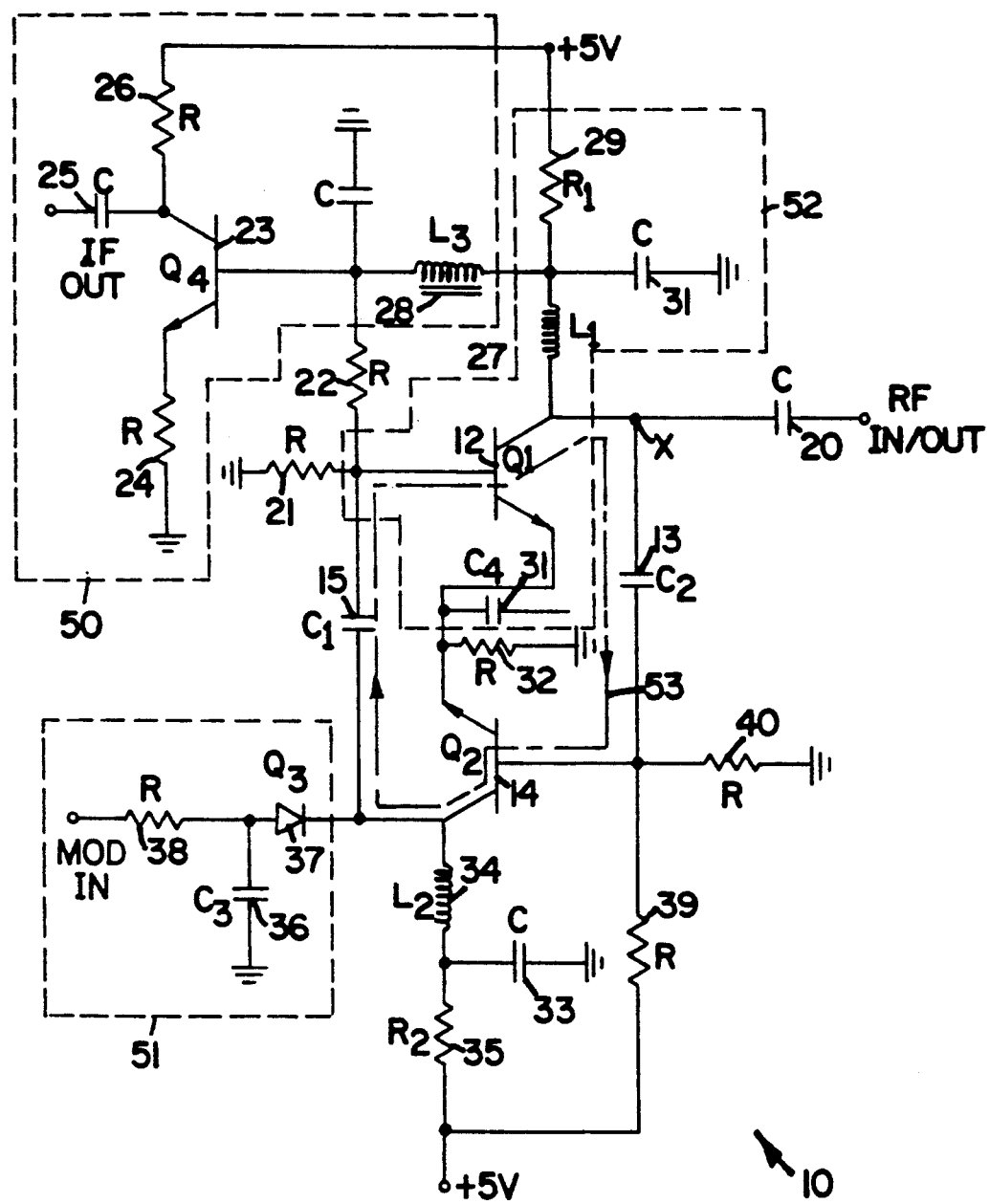
FIG. 2 is a circuit schematic of a preferred embodiment transceiver 10 constructed according to the principles of the present invention.

Referring next to FIG. 2, a preferred transceiver 10 circuit is illustrated. The RF in/out is AC coupled to the circuit via capacitor 20. As noted above, this signal typically is received from antenna 11. The signal enters the transceiver circuit 10 at point X between Q1 12 and C2 13. The signal continues to the base of Q2 14 through the collector to point Y. At point Y, the capacitor C1 15 is connected to the base of Q1 12. A bias resistor 21 connects the base to ground. An isolation resistor 22 connects Q1 12 to the base of Q4 23. This resistor is large on the order of greater than 1000 ohms. By including the IF output from the collector of Q1 12, a certain amount of regenerative feedback through resistor 22 is achieved which improves the performance and gain of the IF output. Q4 has a base resistor 24, isolation capacitor 25, and pull-up resistor 26 to the power supply (not shown).

Also connected to the collector of Q1 12 is inductor L1 27 which centers the negative resistance of the oscillator. L3 28 eliminates the high frequency included in the mixer signal to pass through the lower frequency of interest (LO) to the IF out. R1 29 and capacitor 30 are used to bias the circuit.

In order to maximize the performance of the mixer function, C4 31 is connected to the emitter of Q1 12 and parallel with resistor 32. Also connected at point Y is one end of inductor L2 34. The other end of inductor L2 34 is connected to capacitor 33 to ground and resistor R2 35 to voltage supply. The base of Q2 14 is connected to voltage divider resistors 39 and 40. Diode 37 is connected with its anode to point Y and its cathode to capacitor 36 and resistor 38. The variable capacitor C3 36 and diode 37 may be constructed by tying a transistor collector and emitter together and reverse biasing the transistor. The reverse biased base-emitter junction of Q3 37 forms a parallel resonator with L1.

The negative resistance necessary for oscillations are shown in the following table.

TABLE I

| Freq-GHZ | RE[Z1] VCO4 | IM[Z1] VCO4 |
|---|---|---|
| 2.00000 | 0.937 | 22.505 |

TABLE I-continued

| Freq-GHZ | RE[Z1] VCO4 | IM[Z1] VCO4 |
|---|---|---|
| 2.50000 | −0.944 | 25.756 |
| 3.00000 | −4.428 | 28.725 |
| 3.50000 | −10.607 | 27.169 |
| 4.00000 | −17.519 | 22.166 |
| 4.50000 | −20.926 | 11.334 |
| 5.00000 | −19.575 | 0.133 |
| 5.50000 | −13.174 | −8.519 |
| 6.00000 | −6.358 | −13.390 |
| 6.50000 | −0.836 | −14.821 |
| 7.00000 | 3.192 | −15.150 |
| 7.50000 | 6.148 | −15.026 |
| 8.00000 | 8.354 | −14.741 |

In the preferred embodiment, devices Q1 and Q2 are preferably microwave silicon bipolar transistors, such as the type manufactured by Avatek, Inc. of Santa Clara, Calif. with a Gain Bandwidth Product in the 8 GHz range and above. However, as those skilled in the art will appreciate, other devices will work in the transceiver 10, with the selection of the device dependant upon the frequency range of interest.

The IF amplifier means is designated as 50, the tuning means as 51, and the mixer means as 52. The oscillator loop is illustrated as a hatched line designated by 53.

In Operation

In operation, the two device active feedback and the ring configuration generates the negative resistance necessary for oscillation. More specifically, normal noise at the output of Q1 is coupled through capacitor C2 and amplified by Q2, which is in turn coupled through C1 to the input of Q1. The resulting loop forms a 0° phase shift via the throughput phase shift of Q1 and Q2 and the phase shift of C1 and C2 forming 0° around the loop, and thus maintaining the oscillation frequency around the loop.

Inductor L1 is not required for the oscillator frequency, but may be used in order to move the negative resistance at the output of Q2 to a higher frequency. L2 can then be used to further move the oscillation frequency higher. Q3, which is preferably a base-emitter junction of silicon transistor, can be used as a variable capacitor from the output of Q2 to ground. When connected parallel with L2 to ground, it acts as a variable "tank circuit" to form a voltage control oscillator ("VCO").

To create a mixer, an incoming signal at the RF input/output is coupled off through C2 to the input of Q2, where it is amplified to the collector output, and is then coupled through C1 to the input of Q1. The signal is further amplified to the collector output of Q1, which is operating in a saturated mode to form a nonlinear circuit which performs the mixing function of the oscillator circuit in the incoming signal. That IF output then is coupled off to L1 and through RF choke L3 to the input of Q4 where it is amplified to the IF output. Resistor R1 is much much greater than R2. The IF output is not shunted to ground and is directed to the input of Q4.

As an oscillator, the emitter resistor to ground does not provide an AC return required to generate the negative resistance. There is a virtual ground that exists at the emitters of Q1 and Q2. However, this emitter junction is not required to be AC referenced to ground for the circuit to act as an oscillator. To perform the mixer function, the emitter junction of Q1 should include an AC ground (i.e., through capacitor C4). Therefore, C4 is desired to improve Q2's functionality as a mixer, but it is not required for the oscillating function.

A proximity fuze is typically required to detect signals down to DC level. Thus, the Q4 base bias is direct coupled to the collector Q1 bias. This allows IF signals down to DC to be directed to Q4 and amplified to the IF output. The base bias for Q4 is best tapped at the junction L1 R1 to provide a regenetive feedback for the IF signal which improves the conversion loss of the Q1 in its mixing function.

Figure 3:
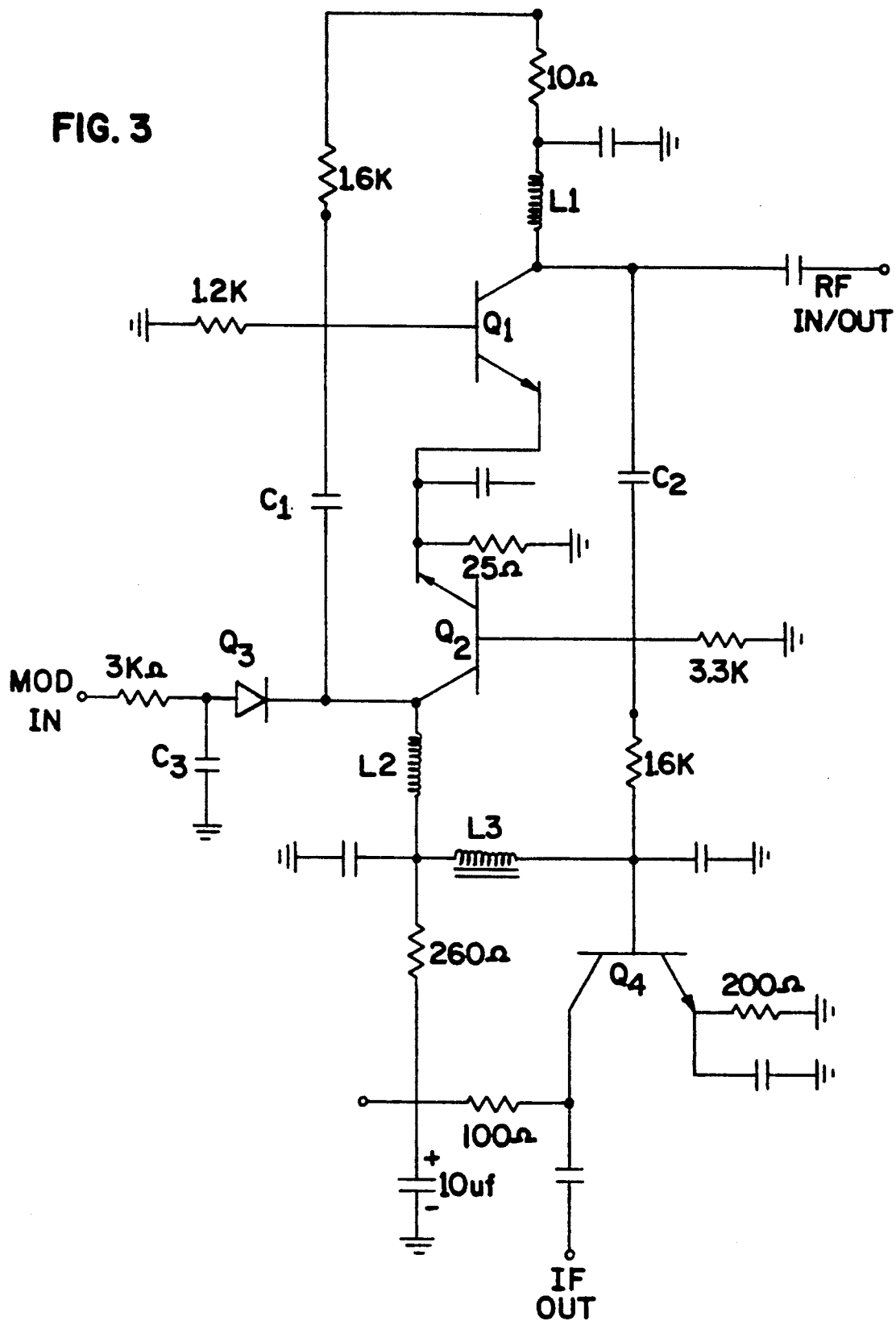
FIG. 3 is an alternative embodiment of the circuit of FIG. 2.

An alternate circuit topology (best seen in FIG. 3) takes the input of Q4 and ties it to the junction of L2 and R2, thereby allowing the R1 resistor value to be very small. This also increases the output power capability of Q1 by having the input of Q4 at L2 and R2. R2 must then be much much greater than R1 to provide an IF return to Q4. However, the drawback of doing that reduces the voltage on Q2 collector, which reduces the variable capacitance range of Q3, and thereby decreases the FM deviation capability of the voltage control oscillator.

It will be appreciated that the table above and devices are presented by way of an example of characteristics of an embodiment of transceiver 10 and should not be viewed as limiting.

It will also be appreciated that the principles of this invention apply not only to the circuitry used to implement the invention, but also to the method of generating an oscillation frequency to a radar system.

The commonly assigned and copending U.S. patent Ser. No. 07/712,931, titled "VOLTAGE CONTROLLED OSCILLATOR" (filed Jun. 10, 1991) is hereby incorporated herein by reference.

While a particular embodiment of the invention has been described with respect to its application for use in a radar system, it will be understood by those skilled in the art that the invention is not limited by such application or BJT embodiment, or to the particular circuits disclosed and described herein. It will be appreciated by those skilled in the art that other circuit configurations that embody the principles of this invention and other applications therefor, other than as described herein, can be configured within the spirit and intent of this invention. The circuit configurations described herein are provided as only two examples of preferred embodiments which incorporate and practice the principles of this invention. Other modifications and alterations are well within the knowledge of those skilled in the art and are to be included within the broad scope of the appended claims.

We claim:

1. An oscillator, comprising:
   (a) a first bipolar junction transistor ("BJT"), having a base, a collector and an emitter;
   (b) a second BJT, having a base, a collector and an emitter, wherein said collector of said first BJT is cooperatively connected to said base of said second BJT through a second capacitive device, said collector of said second BJT is cooperatively connected to said base of said first BJT through a first capacitive device, and said emitters are connected together,
   wherein when said first and second BJT are properly biased a zero phase shift oscillation occurs from said base to said collector of said first BJT through said second capacitive device, to said base to said collector of said second BJT through said first capacitive device, and to said base of said first BJT, whereby a tank circuit is not required for the oscillation to occur.

2. The oscillator of claim 1, further including a first inductive means, cooperatively connected said collector of said first BJT, for centering the negative resistance of the oscillator, wherein higher frequency oscillations can be achieved.

3. The oscillator of claim 1, further including variable capacitor means in parallel with second inductor means, cooperatively connected to said collector of said second BJT, for varying the oscillation frequency as a function of voltage.

4. The oscillator of claim 1, further including an IF output port cooperatively connected to said first inductive means, said port comprising a high frequency filter and an amplifier device.

5. The oscillator of claim 1, further including a capacitive device cooperatively connected to ground from said emitters, wherein said first BJT operates as a mixer.

6. The oscillator of claim 1, wherein said oscillation loop adds to a zero degree phase shift, such that active feedback causes oscillations.

7. The oscillator of claim 2, further including variable capacitor means in parallel with second inductor means, cooperatively connected to said collector of said second BJT, for varying the oscillation frequency as a function of voltage.

8. The oscillator of claim 7, further including an IF output port cooperatively connected to said first inductive means, said port comprising a high frequency filter and an amplifier device.

9. The oscillator of claim 8, further including a capacitive device cooperatively connected to ground from said emitters, wherein said first BJT operates as a mixer.

10. The oscillator of claim 9, wherein said oscillation loop adds to a zero degree phase shift, such that active feedback causes oscillations.

11. A radar comprising:
(a) a voltage controlled oscillator including:
(i) a first bipolar junction transistor ("BJT"), having a base, a collector and an emitter;
(ii) a second BJT, having a base, a collector and an emitter, wherein said collector of said first BJT is cooperatively connected to said base of said second BJT through a second capacitive device, said collector of said second BJT is cooperatively connected to said base of said first BJT through a first capacitive device, and said emitters are connected together,
wherein when said first and second BJT are properly biased a zero phase shift oscillation occurs from said base to said collector of said first BJT through said second capacitive device, to said base to said collector of said second BJT through said first capacitive device, and to said base of said first BJT, whereby a tank circuit is not required for the oscillation to occur, and wherein said second BJT performs a mixer function; and
(b) an antenna cooperatively connected between said second capacitive device and said first BJT.

12. The radar of claim 11, further comprising an RF choke for passing LO signals.

13. The radar of claim 12, further comprising an amplifier for increasing the gain of said LO signal to an IF output port.

14. The radar of claim 13, further comprising processing circuitry for analyzing said IF output port signals.

* * * * *